United States Patent
Ali

(10) Patent No.: US 7,271,750 B1
(45) Date of Patent: Sep. 18, 2007

(54) PIPELINED CONVERTER SYSTEMS WITH ENHANCED ACCURACY

(75) Inventor: Ahmed Mohamed Abdelatty Ali, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/473,650

(22) Filed: Jun. 22, 2006

(51) Int. Cl.
*H03M 1/06* (2006.01)

(52) U.S. Cl. .................... 341/118; 341/155

(58) Field of Classification Search ........... 341/161, 341/118, 120, 172, 162
See application file for complete search history.

(56) References Cited

U.S. PATENT DOCUMENTS

| | | | |
|---|---|---|---|
| 6,184,809 B1 * | 2/2001 | Yu ............... | 341/120 |
| 6,369,744 B1 | 4/2002 | Chuang ........... | 341/161 |
| 6,441,769 B1 | 8/2002 | Nagaraj .......... | 341/161 |
| 6,501,400 B2 | 12/2002 | Ali .............. | 341/118 |
| 6,563,445 B1 * | 5/2003 | Sabouri .......... | 341/120 |
| 6,686,864 B1 | 2/2004 | Moreland ......... | 341/161 |
| 6,756,929 B1 * | 6/2004 | Ali .............. | 341/161 |
| 6,784,814 B1 | 8/2004 | Nair et al. ...... | 341/118 |
| 7,009,548 B2 * | 3/2006 | Chiang et al. .... | 341/161 |
| 7,187,318 B1 * | 3/2007 | Lee et al. ....... | 341/161 |

OTHER PUBLICATIONS

E. J. Siragusa, et al., "Gain error correction technique for pipelined analogue-to-digital converters", Electronics Letters, 36, pp. 617-618, Feb. 7, 2000.

S. H. Lewis, et al., "A 10-b 20 Msample/s analog-to-digital converter", IEEE J. Solid-State Circuits, 27, pp. 351-358, Mar. 1992.

J. Ming and S.H. Lewis, "An 8b 80Msample/s pipelined ADC with background calibration", IEEE ISSCC, Oct. 2000, 3 pagess.

Ali, A. M. A. et al., "Correction of Operational Amplifier Gain Error in Pipelined ADCs" IEEE International Symposium on—Systems, ISCAS, Oct. 2001, pp. 568-571.

(Continued)

*Primary Examiner*—Brian Young
(74) *Attorney, Agent, or Firm*—Koppel, Patrick, Heybl & Dawson

(57) ABSTRACT

Converter system embodiments are formed with signal-processing stages which include successive signal converters and a preceding signal sampler wherein all but a last one of the stages provides an output signal to a succeeding one of the stages and all of said signal converters generate a corresponding digital code. The system embodiments generally address a selected one of the stages and include controllers which are configured to process, at a process rate less than the system's sample rate, a digital error signal and the back-end digital code of back-end ones of signal converters that succeed the selected stage to thereby adjust at least one of the back-end digital code and a control voltage in the selected stage to enhance the accuracy of the system digital code. Once the processes of these embodiments have been applied to the selected stage, they may be successively applied to preceding stages. System embodiments are also directed to nonlinear amplifier gain by including approximations (e.g., piece-wise and polynomial approximations) of amplifier gain so that they are better directed to an amplifier gain that is appropriate for the signal that is being processed through the amplifier.

24 Claims, 7 Drawing Sheets

OTHER PUBLICATIONS

Ali, A. M. A. et al., "Background Calibration of Operational Amplifier Gain Error in Pipelined ADCs", IEEE Transaction on Circuits and Systems II, Sep. 2003, pp. 631-634.

H.-S. Lee, "A 12-b 600 ks/s digitally self-calibrated pipelined algorithmic ADC", IEEE J. Solid-State Circuits, pp. 509-515, Apr. 1994.

* cited by examiner

PIPELINED CONVERTER SYSTEMS WITH ENHANCED ACCURACY

BACKGROUND OF THE INVENTION

1. Field of the Invention

The present invention relates generally to pipelined signal converters.

2. Description of the Related Art

Pipelined analog-to-digital signal converters are attractive choices for high-speed, high-resolution applications (e.g., cable modems in telecommunication systems). By breaking down the total number of desired bits into a cascade (pipeline) of low resolution signal converters, pipelined systems achieve high resolution at sampling speeds that are difficult, if not impossible, to realize with other converter systems.

Although their conversion accuracy is generally high, limitations in elements of current pipeline converter systems do introduce conversion errors and numerous techniques have been proposed to reduce these conversion errors. Some of these techniques, however, do not always maintain their error reduction over variations in parameters such as temperature, fabrication process and supply voltage. In addition, others of these techniques modify the signal conversion path of converter systems and this modification creates a window for introduction of noise which may degrade system accuracy.

BRIEF SUMMARY OF THE INVENTION

The present invention is generally directed to pipelined converter systems and methods. The drawings and the following description provide an enabling disclosure and the appended claims particularly point out and distinctly claim disclosed subject matter and equivalents thereof.

DETAILED DESCRIPTION OF THE INVENTION

FIGS. 1-9 illustrate converter system embodiments that have enhanced conversion accuracy. These system embodiments are directed to signal-processing stages which include successive signal converters and a preceding signal sampler wherein all but a last one of the stages provides an output signal to a succeeding one of the stages and all of the signal converters generate a corresponding digital code.

The system embodiments generally address a selected one of the stages and include controllers that are configured to process, at a process rate less than the converter's sample rate, a digital error signal and the back-end digital code of back-end ones of signal converters that succeed the selected stage to thereby adjust at least one of the back-end digital code and a control voltage in the selected stage to enhance the accuracy of the system digital code.

In a system embodiment, a controller comprises a gain estimator that forms an estimate which corresponds to amplifier gain in the selected stage and a back-end adjustor that adjusts the back-end digital code in accordance with the estimate. In another system embodiment, a controller comprises a control-voltage controller that is configured to find a control-voltage value which enhances the amplifier gain and a converter that converts the control-voltage value to provide a corresponding control voltage to the amplifier of the selected stage. Once the processes of these embodiments have been applied to the selected stage, they may be successively applied to preceding stages.

System embodiments not only address finite gain in an amplifier of a selected stage but, in a significant feature of the invention, also address amplifier gain that varies with amplitude of the system's analog input signal. That is, system embodiments are also directed to nonlinear amplifier gain. These nonlinear embodiments are configured with the recognition that amplifier gain is generally a function of the amplitude of the signal being processed and that processes which have been realized for signal amplitudes when the system is processing small analog input signals may not be suitable when the system is subsequently processing signals with significantly larger amplitudes. System embodiments are thus provided which include approximations (e.g., piecewise and polynomial approximations) of amplifier gain so that they are better directed to an amplifier gain that is appropriate for the signal that is being processed through the amplifier.

Figure 1:
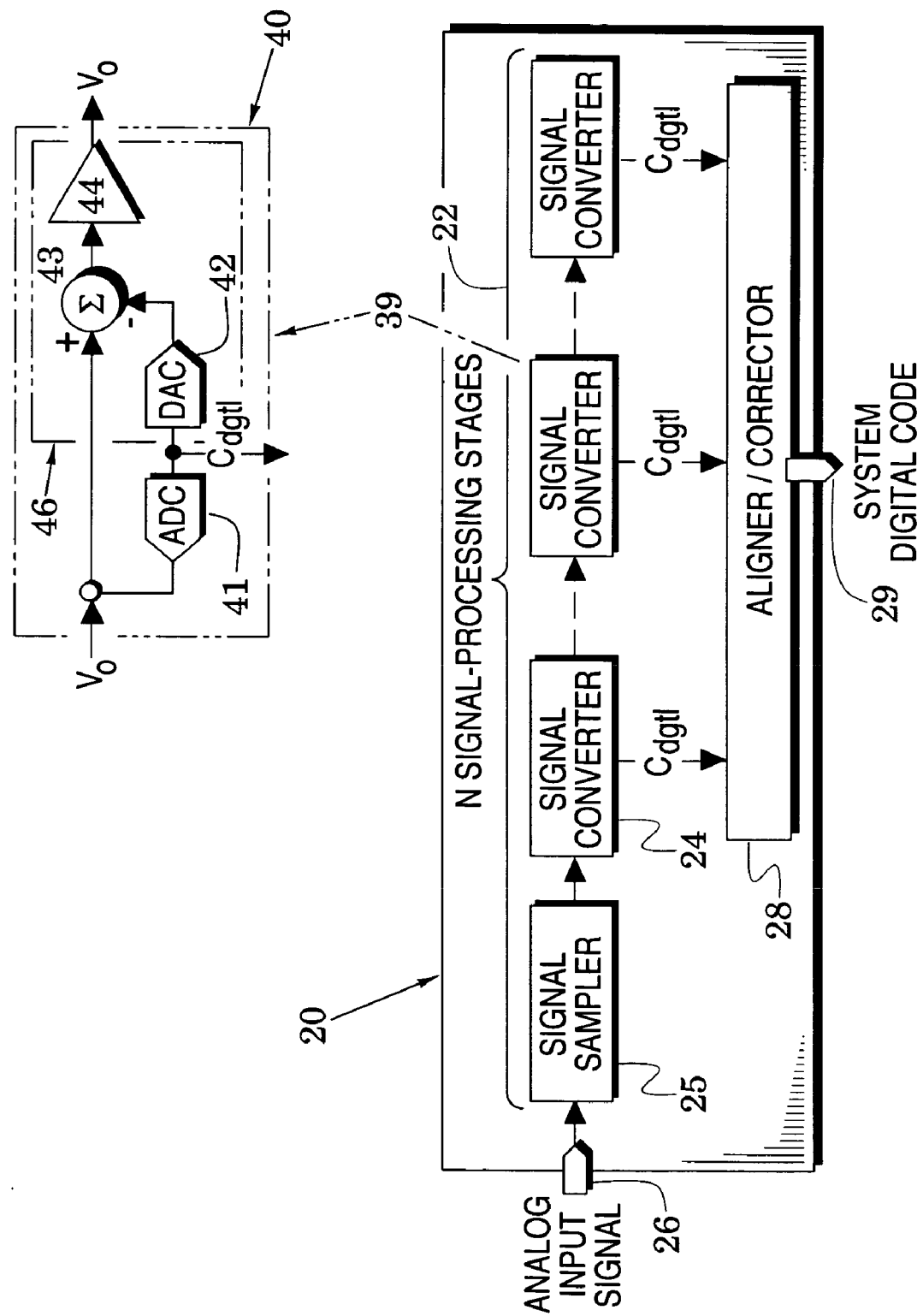
FIG. 1 is a block diagram of a converter system embodiment of the present invention that has successively-arranged signal-processing stages.
Figure 2:
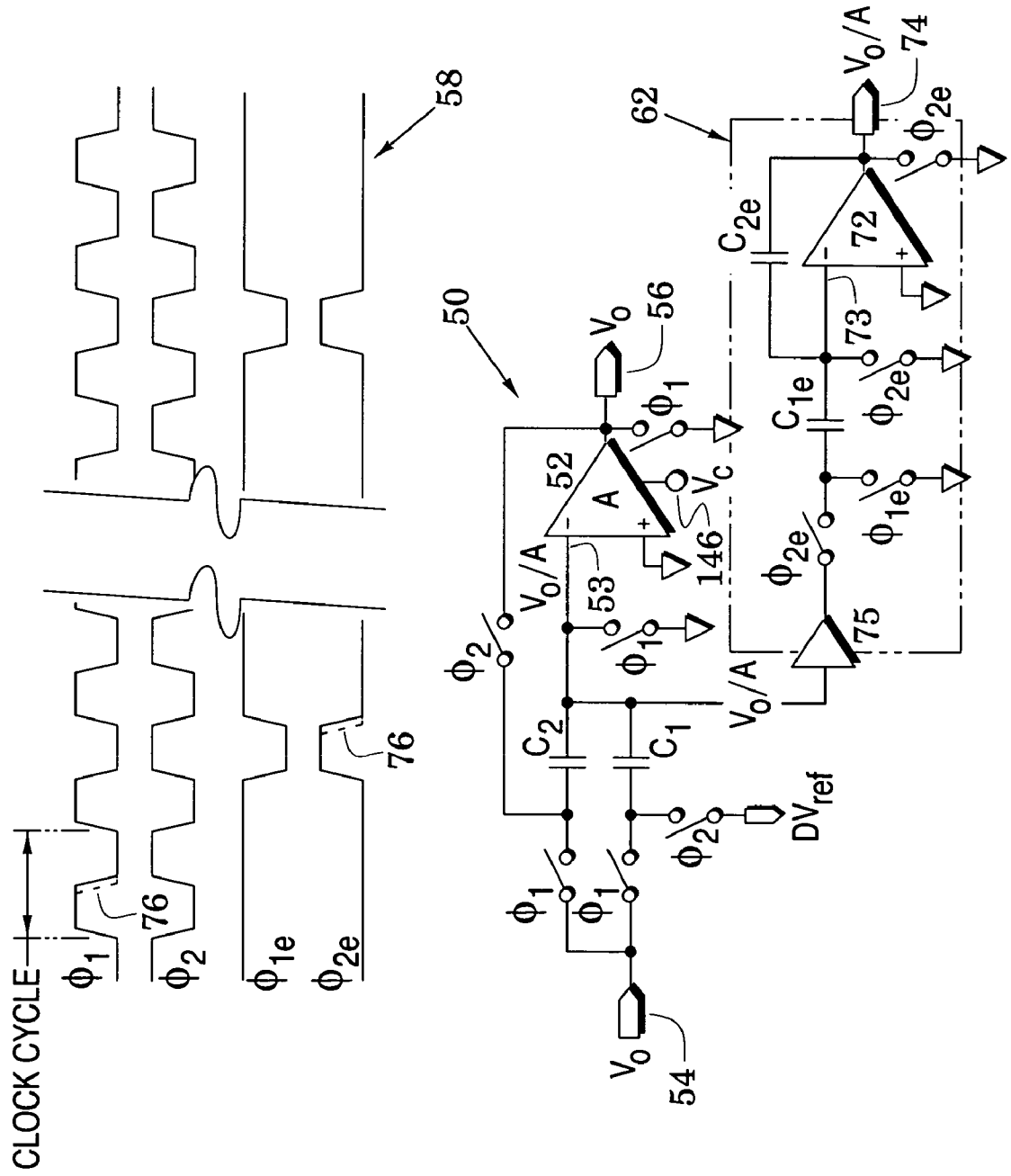
FIG. 2 is a schematic and timing diagram of a multiplying digital-to-analog converter embodiment for use in signal converter stages of the system of FIG. 1.
Figure 3:
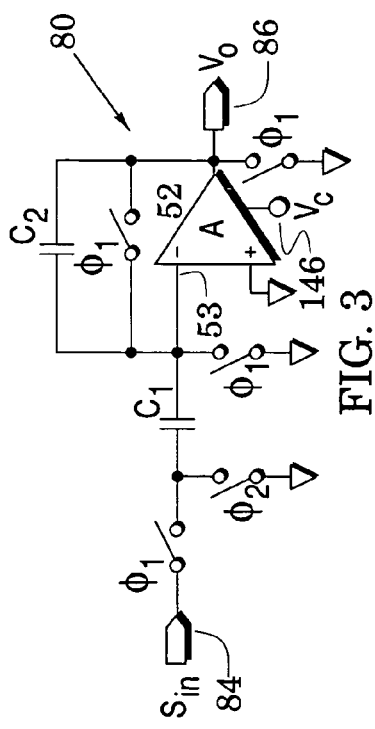
FIG. 3 is a schematic of a signal sampler embodiment in the system of FIG. 1.

To enhance an understanding of embodiments of the present invention, attention is initially directed to the analog-to-digital converter system 20 of FIG. 1 and to FIGS. 2-3 which illustrate signal converter and signal sampler embodiments that may be used in an embodiment of the system 20. As shown in FIG. 1, the system 20 is formed with N successively-arranged signal-processing stages 22 which include N−1 successive signal converters 24 and a preceding signal sampler 25.

The signal sampler 25 is thus positioned to receive an analog input signal from an input port 26 and provide signal samples at a sample rate to the signal converters 24. All but a last one of the stages includes an amplifier that facilitates generation of an output signal which is passed to a succeeding one of the stages for conversion into a corresponding digital code.

In operation of the system 20, the stages 22 operate in successive clock cycles that proceed at the sample rate. In a first clock cycle, the signal sampler 25 provides a sample of the analog signal to the initial one of the signal converters 24. The initial signal converter converts the sample to a corresponding digital code $C_{dgtl}$ and provides an output signal in the form of a "gained up" residue signal to the succeeding converter stage. During each succeeding clock cycle, each succeeding signal converter then converts the output signal of the preceding stage to a corresponding digital code $C_{dgtl}$ and provides an output signal to the succeeding signal converter. A final signal converter simply converts the output signal of the preceding stage to a corresponding digital code $C_{dgtl}$.

It is noted that the successive digital codes $C_{dgtl}$ that correspond to the original sample are only present in successive clock cycles. Therefore, an aligner/corrector 28 is provided to successively delay earlier digital codes to thereby temporally align all digital codes $C_{dgtl}$ that correspond to the original sample.

The signal converters 24 are typically configured to provide redundant code bits and the aligner/corrector 28 is configured to use these redundant code bits to correct conversion errors which may occur when the analog input signal is near transition points between analog regions that correspond to adjacent digital codes. Essentially, the redundant bits provide additional conversion information which allows the aligner/corrector 28 to correct the conversion errors. After code alignment and correction, the aligner/corrector 28 presents, at an output port 29, the system digital code that corresponds to the original sample of the analog input signal.

Example arrow 39 points to an exemplary embodiment 40 of one of the signal converters 24. In this embodiment, an analog-to-digital converter (ADC) 41 converts the output signal $V_o$ of a preceding one of the stages 22 to the corresponding digital code $C_{dgtl}$. A digital-to-analog converter (DAC) 42 converts this digital code to a corresponding analog signal which is differenced with the output signal $V_o$ in a summer 43 to provide a residue signal. The residue signal is then "gained up" in an amplifier 44 to provide an output signal to a succeeding one of the stages. This gain is sized to provide an analog window to the succeeding stage that substantially matches the analog window presented to the current stage.

Because of the above-described operation, a portion 46 of the signal converter embodiment 40 is generally referred to as a multiplying digital-to-analog converter (MDAC). A switched-capacitor embodiment 50 of an MDAC is shown in FIG. 2 to include a differential amplifier 52 having an amplifier gain A and capacitors $C_1$ and $C_2$ that are coupled to a summing node 53 of the amplifier. Switches $\phi_1$ couple each of the capacitors $C_1$ and $C_2$ to an input port 54 that receives the output signal of a preceding stage (22 in FIG. 1). Another switch $\phi_1$ couples the other terminals of the capacitors $C_1$ and $C_2$ to ground and a final switch $\phi_1$ couples the output of the amplifier 52 to ground.

A switch $\phi_2$ couples one end of the capacitor $C_2$ to the output of the differential amplifier 52 which also defines an output port 56. Another switch $\phi_2$ couples a corresponding end of the capacitor $C_1$ to receive a signal $DV_{ref}$ in which $V_{ref}$ represents one half of the analog window presented to the MDAC 50 and D is a value that corresponds to the digital code $C_{dgtl}$ of the MDAC's associated ADC (41 in FIG. 1).

In FIG. 2, the switches $\phi_1$ and $\phi_2$ have been indicated by the clock signals that cause them to close. For example an exemplary clock signal $\phi_1$ is shown in a timing diagram 58 of FIG. 2 and an exemplary clock cycle is also indicated. In the first half of the clock cycle, the switches $\phi_1$ close so that the output signal $V_o$ of a preceding stage (22 in FIG. 1) injects electrical charges into capacitors $C_1$ and $C_2$. One of the switches $\phi_1$ insures that the output of the differential amplifier 52 is set to zero.

In the second half of the clock cycle, switches $\phi_2$ close so that at least a portion of the injected charge in capacitor $C_1$ is transferred to capacitor $C_2$ to thereby realize a stage gain G of $(C_1+C_2)/C_2$ and, with this stage gain, generate the output signal $V_o$ of the current stage at the output port 56. In particular, this charge injection and transfer operation will cause the MDAC 50 of FIG. 2 to generate an output signal of, $$V_o = \frac{(C_1+C_2)/C_2}{1+(C_1+C_2)/(AC_2)} V_o - \frac{C_1 C_2}{1+(C_1+C_2)/(AC_2)} DV_{ref} \quad (1)$$

which becomes, $$V_o = \frac{G}{1+G/A}(V_o - DV_{ref}/2) \quad (2)$$

when the stage gain G is substituted. The MDAC 50 may be used in each of the signal converters 24 of FIG. 1 except the last of these converters. As mentioned above, the last signal converter has no need to generate an output signal $V_o$.

If the capacitor values $C_1$ and $C_2$ remain constant and the amplifier gain A is infinite, equation (2) would reduce to an ideal output signal of $$\text{ideal } V_o = G(V_o DV_{ref}/2) \quad (3)$$

The assumption that the capacitor values will be constant is generally reasonable given that current fabrication technologies achieve capacitor matching with excellent accuracy (e.g., 12-bit accuracy). The current invention recognizes, however, that it is difficult to realize a large open-loop amplifier gain A at the high operating speeds of modern pipelined converter systems. It is apparent that a finite amplifier gain A will cause the output signal of equation (2) to differ from that of equation (3) and this difference represents error in the output signal $V_o$.

It is important to note that any error induced into the output signal $V_o$ of equation (2) will induce error in the corresponding digital code $C_{dgtl}$ of all succeeding signal converters and this error cannot be corrected by the aligner/corrector 28 of FIG. 1 because, essentially, all succeeding signal converters are presented with incorrect analog signals so that even perfect stage conversion will produce error.

Because a finite amplifier gain induces error into the output signal of equation (2), system embodiments of the present invention are directed to reduction of this error. These embodiments are obtained with the further recognition that substitution from equation (2) into equation (3) yields, $$\text{ideal } V_o = V_o(1+G/A) = V_o + V_o G(1/A) = V_o + V_o G\alpha. \quad (4)$$

wherein $\alpha$ is $1/A$ and is therefore an estimate indicative of the amplifier gain A. Thus, the accuracy of the output signal $V_o$ can be substantially enhanced with addition of an error term $V_o G\alpha$ that is formed by the product of the output signal, the stage gain and the estimate $\alpha$. The stage gain G is known and inspection of FIG. 2 reveals that an error signal $V_o/A$ (which provides the product $V_o \alpha$) is available at the summing node 53 of the amplifier 52. Although various digital processes and structures can be effectively used to realize equation (4), it is recognized that digital division is an inefficient process so that it is preferable to effect these processes and structures with the estimate $\alpha$.

To reduce any perturbation of the operation of the MDAC 50 of FIG. 2, the error signal $V_o/A$ is preferably provided with an extraction amplifier such as the switched-capacitor amplifier 62 that is shown in FIG. 2. This extraction amplifier includes a differential amplifier 72 and capacitors $C_{1e}$ and $C_{2e}$ that are coupled to a summing node 73 of the amplifier. Another terminal of the capacitor $C_{2e}$ is coupled to the output of the amplifier 72 and to an output port 74.

A switch $\phi_{2e}$ couples another terminal of capacitor $C_{1e}$ to the summing point 53 of the differential amplifier 52 of the MDAC 50. A switch $\phi_{1e}$ couples this same terminal of the capacitor $C_{1e}$ to ground and another switch $\phi_{2e}$ couples the summing point 73 to ground. A final switch $\phi_{2e}$ couples the output of the amplifier 72 to ground. To further reduce any disturbance of the summing point 53 in the MDAC 50, a buffer stage 75 can be inserted between this summing point and the amplifier 62. The switched-capacitor amplifier 62 preferably has a gain of one so that it provides the error signal $V_o/A$ at its output port 74.

As shown in FIG. 2, the clock cycles of the $\phi_1$ and $\phi_2$ switches of the MDAC 50 are arranged to realize the extremely high speed of pipelined converter systems. The present invention realizes, however, that the switched-capacitor amplifier 62 need not work at this high speed and, accordingly, FIG. 2 shows clock signals $\phi_{1e}$ and $\phi_{2e}$ that have a significantly lower repetition rate. The extraction rate of the extraction amplifier 62 is thus significantly lower than the sample rate of the signal sampler 25 of FIG. 1 and this significantly-lower rate substantially reduces the system power consumption.

When clock signal $\phi_{2e}$ occurs, switches $\phi_{2e}$ permit the buffer stage 75 to inject a charge into capacitor $C_{1e}$ that corresponds to the error signal at the summing point 53 of the amplifier 52. It is noted that this time corresponds with the time that switches $\phi_2$ of the MDAC 50 close and establish the output signal $V_o$ at the output port 56. As described above, this is the time that the error signal $V_o/A$ is present at the summing point 53.

When clock signal $\phi_{1e}$ occurs (as indicated, it preferably spans a great many of the clock cycles of the clock signals $\phi_1$ and $\phi_2$), the switch $\phi_{1e}$ causes charge in capacitor $C_{1e}$ to be transferred to capacitor $C_{2e}$ which generates a signal at the output port 74. The relative size of the capacitors $C_{1e}$ and $C_{2e}$ determines the gain of the switched-capacitor amplifier 62. In an exemplary amplifier embodiment, they are equally sized so that the switched-capacitor amplifier has a gain of one and the output port 74 thus provides a duplicate of the error signal $V_o/A$.

The clock signals of FIG. 2 are shown to have versions of the clock signals $\phi_1$ and $\phi_{2e}$ that have an early termination edge 76. Preferably, this version of the clock signal $\phi_1$ is applied to the switch $\phi_1$ that is coupled to the summing node 53 in FIG. 2. Accordingly, this switch $\phi_1$ opens early to accurately set the charge accumulated in the capacitors $C_1$ and $C_2$ prior to the occurrence of transients that are generated by closing and opening of any of the other switches in the MDAC 50. This early opening enhances the accuracy of the charge injected from the preceding stage. Similarly, this version of the clock signal $\phi_{2e}$ is applied to the switch $\phi_{2e}$ that is coupled to the summing node 73 in FIG. 2. Accordingly, this switch $\phi_{2e}$ opens early to accurately set the charge accumulated in the capacitor $C_{1e}$.

Figure 4:
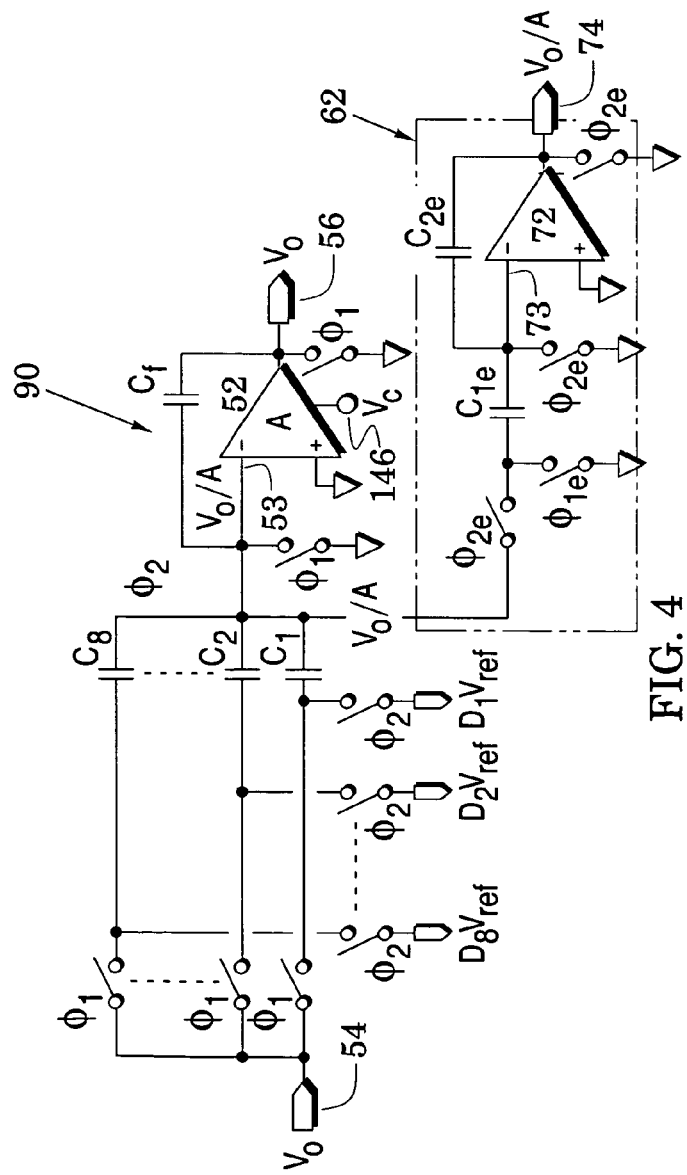
FIG. 4 is a schematic and timing diagram of another multiplying digital-to-analog converter embodiment for use in signal converter stages of the system of FIG. 1.

Before further development and application of the concepts included in equation (4), attention is directed to FIGS. 3 and 4 which respectively illustrate an embodiment 80 of the signal sampler 25 of FIG. 1 and another embodiment 90 of the MDAC 40 of FIG. 1. The signal sampler 80 is similar to the MDAC 50 of FIG. 2 with like elements indicated by like reference numbers. The input and output ports are renumbered 84 and 86 to show that they are different ports. Also in contrast to the MDAC 50, the second capacitor $C_2$ is coupled about the amplifier 52 so that associated ones of the switches $\phi_1$ and $\phi_2$ are removed.

In operation of the signal sampler 80, the switches $\phi_1$ close during the first half of the clock cycle of FIG. 2 so that an analog input signal $S_{in}$ at an input port 114 injects electrical charge into the capacitor $C_1$ and charge is cleared from capacitor $C_2$. In the second half of the clock cycle, the switch $\phi_2$ closes so that the injected charge of capacitor $C_1$ is transferred to the capacitor $C_2$ to thereby realize the output signal $V_o$ at the output port 56. This output signal is a sample of the analog input signal of FIG. 1 which is then processed by the signal converters 24 and the aligner/corrector 28 of FIG. 1 to provide the corresponding system digital code. If the capacitors in FIG. 4 are equally sized, the signal sampler 80 has a stage gain G of 1.

The MDAC embodiment 50 of FIG. 2 is configured for use in a 1.5-bit embodiment of the signal converters 24 of FIG. 1. FIG. 4 illustrates another MDAC embodiment 90 that is configured, instead, for a 3-bit signal converter embodiment. This figure includes elements of the MDAC 50 with like elements indicated by like reference numbers. In contrast, however, the MDAC 90 couples a feedback capacitor $C_f$ permanently about the amplifier 52 and couples eight capacitors $C_1$-$C_8$ to the summing node 53. Each of these capacitors is coupled through a respective switch $\phi_1$ to the input port 54 and each is coupled through a respective switch $\phi_2$ to receive a respective signal $D_i V_{ref}$ in which $D_i$ are values that corresponds to the digital code $C_{dgtl}$ of the MDAC's associated ADC (41 in FIG. 1).

The MDAC 50 is suitable for use in one of the signal converters 24 if that converter's digital code has 1.5 bits. In contrast, the MDAC 90 is suitable for use in one of the signal converters 24 if that converter's digital code has 3 bits. MDACs 50 and 90 of FIGS. 2 and 4 are thus representative of the many embodiments of MDACs that may be used in the converter system 20 of FIG. 1. The extraction amplifier 62 of FIG. 2 is also shown in association with the MDAC 90.

Figure 5:
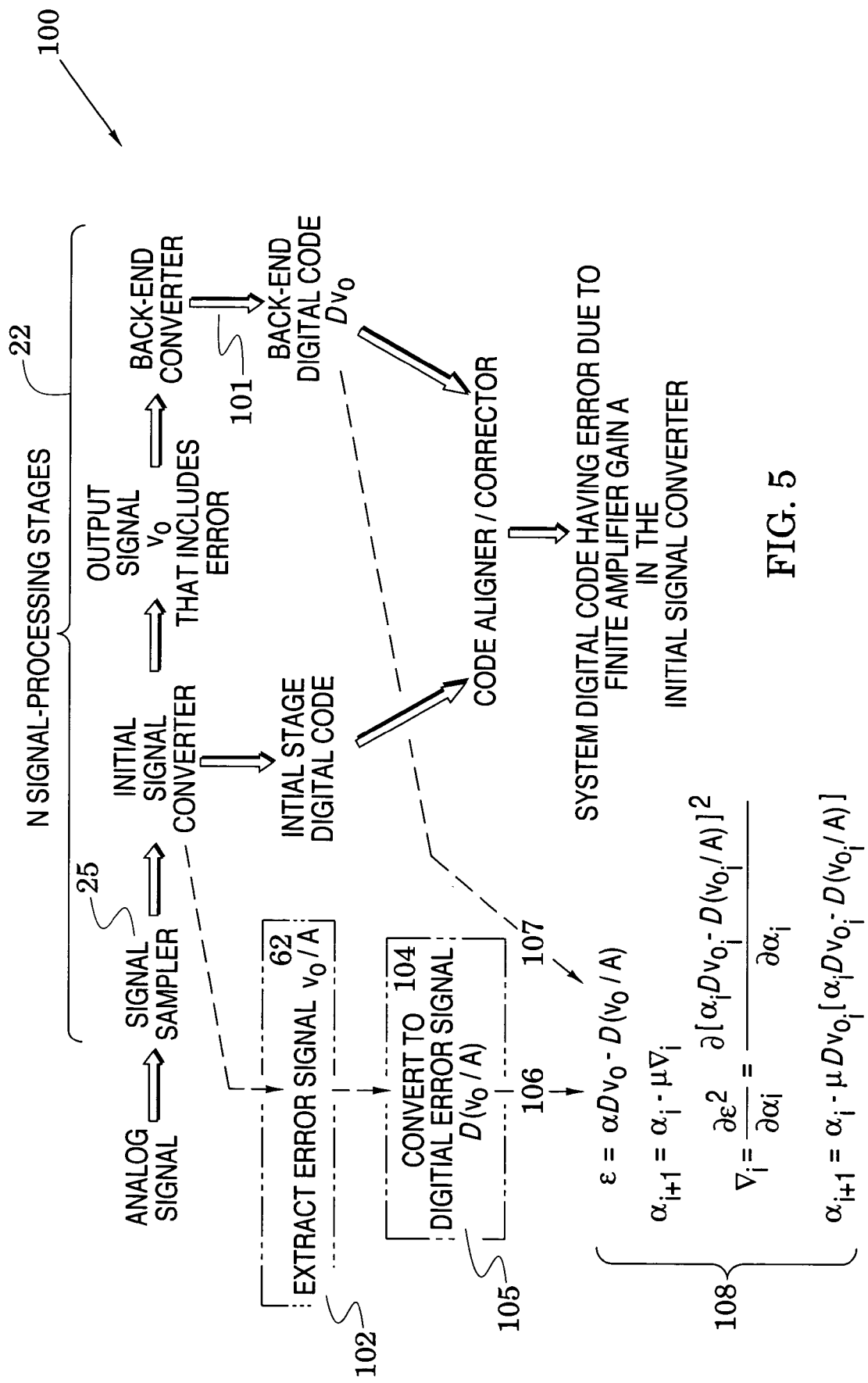
FIG. 5 is a diagram that shows processes of the system of FIG. 1 supplemented by process embodiments for reducing converter error due to finite amplifier gain.

Attention is now directed to a diagram 100 of FIG. 5 which includes the N signal-processing stages 22 of FIG. 1. The stages are arranged in different groups and open process arrows indicate signal processes of these groups. For example, the signal sampler 24 receives an analog input signal and provides samples at a sample rate to the initial one of the signal converters (24 in FIG. 1) which, in response provides an output signal $V_o$ and an initial stage digital code. The remainder of the signal converters are grouped into a back-end converter that, in response to the output signal $V_o$, provides a back-end digital code $DV_o$ (wherein an italic D signifies "digital version of") in a process indicated by open arrow 101.

In response to the initial stage digital code and the back-end digital code $DV_o$, a code aligner/corrector (e.g., the aligner/corrector 28 of FIG. 1) performs code alignment and correction processes which provide a system digital code that corresponds to a respective one of the samples. As recognized above, however, the system digital code includes errors due to the finite amplifier gain A in the signal-processing stages, e.g., in the initial signal converter. The present invention recognizes that this error can be substantially reduced with processes and structures that are indicated with broken lines in FIG. 5.

First, an extraction amplifier similar to the extraction amplifier 62 of FIG. 2 is used in an extraction process 102 to extract the error signal $V_o/A$ introduced above in equation (4). An analog-to-digital converter 104 then converts this signal to a digital error signal $D(V_o/A)$ in a conversion process 105. As previously indicated in the timing diagram 58 of FIG. 2, the extraction amplifier 62 preferably provides the error signal at an extraction rate that is substantially slower than the sample rate (in the signal sampler 25) and, accordingly, the conversion rate is similarly slower which allows the converter 102 to be realized as a slow and relatively inexpensive converter. It is noted, however, that other system embodiments may conduct the extraction and conversion rates at higher rates, e.g., the sample rate.

Broken process lines 106 and 107 in FIG. 5 indicate the availability of the digital error signal $D(V_o/A)$ and the back-end digital code $DV_o$. At this point, it is noted that the digital error signal $D(V_o/A)$ is a measured version of the error signal $V_o/A$ and that a product of the back-end digital code $DV_o$ and the estimate $\alpha$ (introduced in equation (4)) would provide an estimated version of the error signal. In the first of a set 108 of equations shown in FIG. 5, it is thus recognized that the difference between the measured and estimated versions can be expressed as an error $\epsilon$ which is, $$\epsilon = \alpha DV_o - D(V_o/A). \tag{5}$$

A significant goal of the invention is, therefore, to find a value of the estimate $\alpha$ that minimizes the error $\epsilon$. In the limit, equation (5) indicates that the estimate $\alpha$ is a ratio of the digital error signal $D(V_o/A)$ to the back-end digital code $DV_o$. In a method embodiment, therefore, the desired estimate $\alpha$ is obtained with repeated division of the digital error signal by the back-end digital code and averaging of the results.

It is further recognized that the error $\epsilon$ can be efficiently found with adaptive optimization algorithms such as least-mean-square (LMS) algorithms which are special cases of methods of steepest descent that are suitable for use in linear systems. In accordance with these methods, the estimate $\alpha$ can be found from $$\alpha_{i+1} = \alpha_i - \mu \nabla_i \tag{6}$$

in which $\nabla_i$ is a mean-squared error given by $$\nabla_i = \frac{\partial \epsilon^2}{\partial \alpha_i} = \frac{\partial [\alpha_i DV_{o_i} - D(V_{o_i}/A)]^2}{\partial \alpha_i}. \tag{7}$$

In a linear system, the derivative of equation (7) produces $$\alpha_{i+1} = \alpha_i - \mu DV_{o_i}[\alpha_i DV_{o_i} - D(V_{o_i}/A)] \tag{8}$$

which will provide the desired estimate $\alpha$ wherein $\mu$ is a step-size parameter that controls the rate of convergence of equation (8). It is noted that this equation provides the estimate $\alpha$ and avoids digital division which is an inefficient digital process. The convergence time will span the arrival of a number of digital error signals $D(V_o/A)$ and, as previously described, each digital error signal $D(V_o/A)$ is provided at extraction and conversion rates that can be substantially less than the sample rate of the signal sampler 25.

It is noted that equation (8) represents only one of various LMS algorithm embodiments that may be used to find the estimate $\alpha$. For example, the required multiplication can be reduced with the algorithm of $$\alpha_{i+1} = \alpha_i - \mu \text{sign}[DV_{o_i}]\text{sign}[\alpha_i DV_{o_i} - D(V_{o_i}/A)] \tag{9}$$

which only requires signs (i.e., positive or negative) of quantities.

Figure 6:
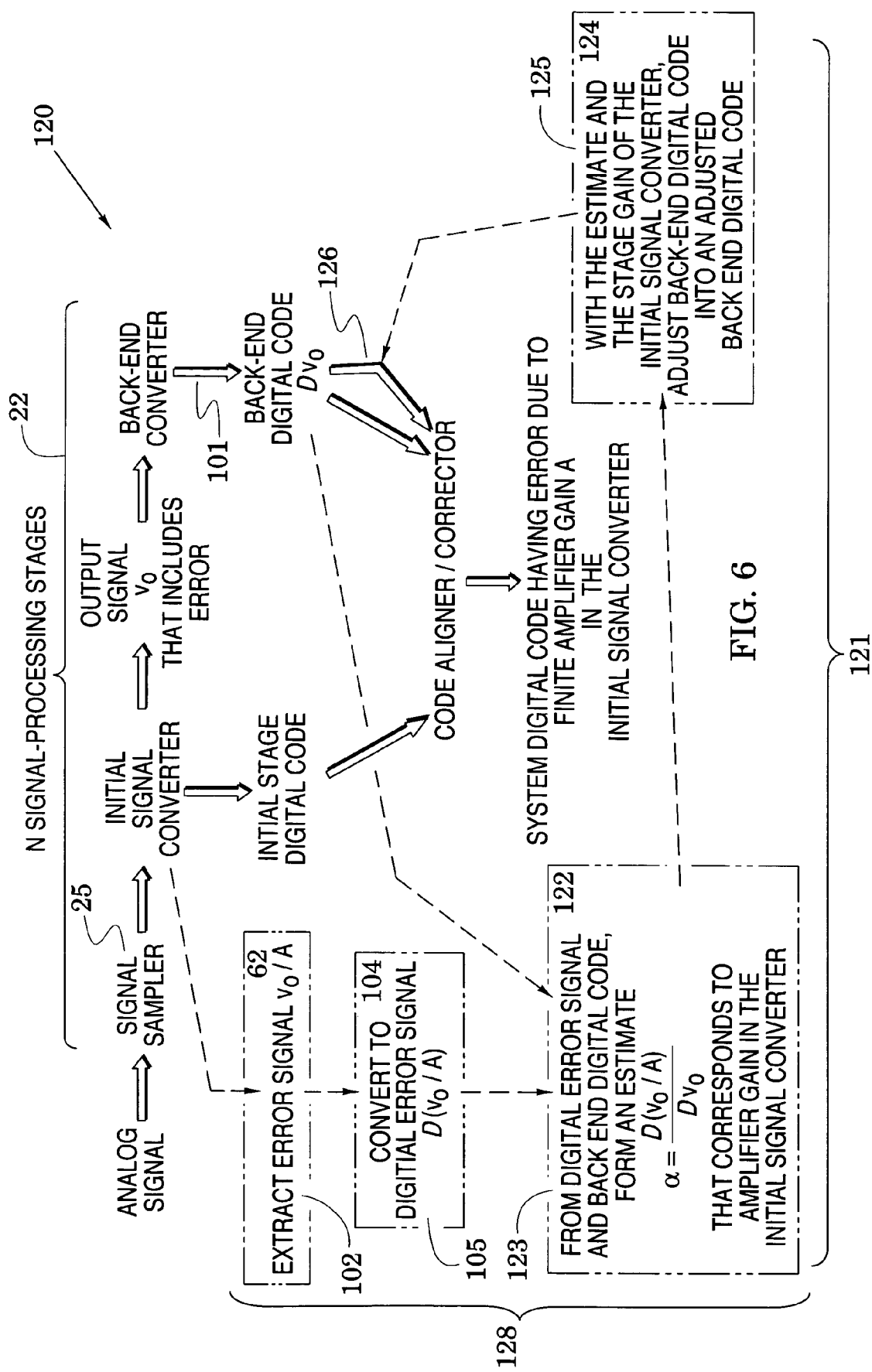
FIG. 6 is a diagram similar to FIG. 5 that shows additional converter processes and structures for reducing converter error due to finite amplifier gain.

The set 108 of equations of FIG. 5 leads to a converter system 120 of FIG. 6 which includes elements of the diagram 100 of FIG. 5 with like elements indicated by like reference numbers. In addition, however, the system 120 has a controller 121 which comprises a gain estimator 122 and a back-end adjuster 124. In accordance with the set 108 of equations in FIG. 5, the gain estimator 122 is configured to form, in a process 123, the estimate $\alpha$ that corresponds to amplifier gain A in the initial signal converter.

In accordance with equation (4), the back-end adjuster 124 can then use the estimate $\alpha$ and the stage gain G of the initial signal converter to adjust, in a process 125, the back-end digital code into an adjusted back-end digital code 126 that substantially enhances the accuracy of the system digital code that is produced by the code aligner/corrector. This adjustment effectively corrects the transfer function of the initial signal converter.

In a system embodiment, the gain estimator 122 and the back-end adjuster 124 operate in accordance with the set 108 of equations in FIG. 5 and with equation (4) and can be realized with various structures such as an appropriately-programmed processor and/or arrays of gates. In one embodiment, for example, they may both be realized with arrays of multipliers and summers.

The system 120 of FIG. 6 effectively addresses conversion degradations that result from reduced amplifier gains in the N signal-processing stages 22. This system and its processes can be realized with simple inexpensive structures that do not require excessive power for their operation. For example, the extraction and conversion processes 102 and 105 can be performed at extraction and conversion rates that can be substantially less than the sample rate in the signal sampler 25. This permits the use of a simple, power-efficient extraction amplifier and a slow, simple and power-efficient signal converter.

Convergence time of the process 123 of the gain estimator 122 is determined by the step-size parameter $\mu$ in equation (8), i.e., the convergence time essentially corresponds to the inverse $1/\mu$ of the step-size parameter. The desired convergence time is a function of the noise in the processing path 128 of FIG. 6 and the desired adjustment accuracy. The algorithm of the gain estimator (e.g., the algorithm of equation (8)) acts as a low pass filter in which the step-size parameter $\mu$ sets the filtering bandwidth. This filtering action should be set to filter the noise to a level lower than the error signal that corresponds to the desired accuracy.

It has been determined, for example, that the power needed for the processing path 128 is less than $1/100$ of the power that the converter system 20 of FIG. 1 draws without this processing path. In an exemplary embodiment, the power need of this processing path can be limited to 5 milliwatts and still achieve a sample rate on the order of 5 megasamples per second (MS/s). In this processing path, an exemplary convergence time is on the order of 8 milliseconds.

A selected value of the step-size parameter $\mu$, therefore, can be based on an acceptable noise level and an acceptable accuracy of the estimate $\alpha$. In general, a smaller value of the step-size parameter $\mu$ will result in slower convergence but a greater degree of filtering. In an exemplary system embodiment, the step-size parameter $\mu$ in can be varied. It can, for example, be initially set to a larger value to reduce convergence time and subsequently reduced to enhance filtering.

If there are times when the system 120 of FIG. 6 does not receive an analog input signal so that input noise is the only input, the estimate processes of the gain estimator 122 will still converge but the convergence time will increase. This increased convergence time can be substantially reduced by occasional injection of a signal (e.g., a dither signal) that is intentionally injected for this purpose. Conversion degradation is avoided by digitally subtracting the injected signal from the system digital code.

The processes and structures of the system 120 of FIG. 6 correct the transfer function of the initial signal converter. It is important to note that they only adjust the back-end digital code $D(V_o)$ and do not, therefore, disturb the system processing along the N signal-processing stages 22. In particular, no correction signals are inserted into this processing string and, accordingly, a possible insertion of noise and consequent introduction of error cannot occur.

In contrast to many structures that have been proposed for reduction of conversion errors due to finite amplifier gain, the system 120 does not require the use of high-speed processing structures (e.g., amplifiers) that run in parallel with at least a portion of the signal-processing stages 22. Because such structures must generally run at the sample rate of the system, they significantly increase the system's current demands.

The system 120 facilitates the use of adaptive optimization algorithms which measure conversion error directly so that measurement errors are second order effects that have minimal effect on correction of stage transfer functions. In addition, these algorithms are fast and can be configured to rapidly converge. They have the effect of filtering noise out of the path through the that leads to the estimate $\alpha$.

The system is particularly suited for high speed converter systems because it permits the use of MDAC amplifiers whose amplifier gain may be reduced because of the high speed requirements. In addition, the system obtains high accuracy without the need for extensive calibration routines.

FIG. 6 shows that the extraction amplifier 62, converter 104 and gain estimator 122 form a processing path 128. The accuracy of this processing path is a function of the open-loop amplifier gain A in the initial signal converter and the desired accuracy of the converter system 120. It has been found, for example, that if the desired system accuracy is 16 bits, the amplifier gain A must then be at least 110 dB to achieve this accuracy.

If, instead, the amplifier gain A drops to 80 dB, the system accuracy can still be realized with an accuracy on the order of 5 bits in the processing path 128. As the amplifier gain drops further, the number of bits in the processing path must increase to compensate. If the amplifier gain A drops to 60 dB, for example, the system accuracy can still be realized with an accuracy on the order of 9 bits in the processing path 128. If the amplifier gain A drops farther to 30 dB, the system accuracy can still be realized with an accuracy on the order of 14 bits in the processing path 128.

Although the initial signal converter was the selected stage in FIGS. 5 and 6 for describing process and structure embodiments of the invention, it is noted that other system embodiments can be directed to other selected stages. This includes the signal sampler 25 of FIG. 6 and all but the final one of the N signal-processing stages. Because a back-end code is not available for this final stage, the embodiments are not generally directed to this stage. If the processes and structures are directed to more than one stage, the transfer function of a selected stage should be addressed only after adjustment has been made for the transfer function of its succeeding stage.

The signal-processing stages 22 of the system 120 of FIG. 6 may generate an offset in the system's transfer function.

Such offsets can be addressed by inserting differences into equation (8). For example, the terms $$D(V_{oi}) \text{ and } D(V_{oi}/A) \qquad (10)$$

can be respectively replaced with terms $$D(V_{oi})-D(V_{oi-1}) \text{ and } D(V_{oi}/A)-D(V_{oi-1}/A). \qquad (11)$$

As previously mentioned, filtering can be introduced to reduce impact of system noise on the algorithms. In addition to varying the step-size parameter $\mu$, this can be realized by using moving averages. For example, equation (8) can be modified to $$\alpha_{i+1} = \alpha_i - \mu D(V_{oi})[\alpha_i D(V_{oi}) - D(V_{oi}/A)]. \qquad (12)$$

Equation (4) was derived with consideration of the MDAC 50 of FIG. 2 and, in particular, consideration of finite gain in an amplifier 52 that generated an output signal $V_o$. This equation demonstrated that the accuracy of the output signal $V_o$ can be substantially enhanced with addition of an error term $V_o G\alpha$ that is formed by the product of the output signal, the stage gain and the estimate $\alpha$. which is an estimate indicative of the amplifier gain A.

Figure 7:
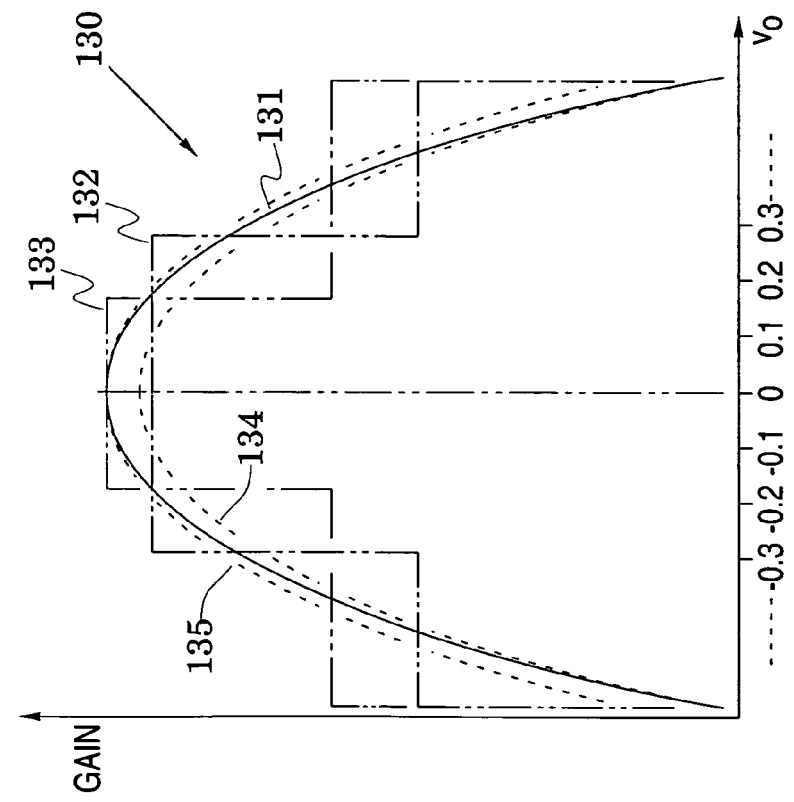
FIG. 7 is a diagram of gain of a typical amplifier in the converter embodiment of FIG. 4.

However, the amplifier gain is not only finite but it generally varies with amplitude of the output signal $V_o$. For example, the graph 130 of FIG. 7 illustrates an exemplary gain plot 131 which shows that amplifier gain A peaks for output signals that have a small amplitude and falls significantly as that amplitude increases. The amplifier gain A is thus nonlinear and an estimate $\alpha$ that is suitable for one value of amplifier gain will fail to provide the desired adjustment of the digital back-end code $DV_o$ at another value. That is, an adjustment that is suitable for analog input signals (at the port 26 of FIG. 1) that have a small amplitude will fail to provide a desired adjustment when the amplitude is significantly larger.

FIG. 7 shows two different piece-wise approximations 132 and 133 that approximate the gain plot 131. For example, these approximations establish one value of the amplifier gain A for small-level signals and another value of the amplifier gain A for large-level signals. When the converter system processes small-level signals, a small-level estimate $\alpha$ that is suitable for these signal levels is used in the methods and structures of FIG. 6 to adjust the digital back-end code $DV_o$. When the converter system processes large-level signals, a large-level estimate $\alpha$ is used. The approximations 132 and 133 of FIG. 7 provide two gain approximations. Other processing embodiments of the invention add further levels of gain approximation to more accurately approximate the gain plot 131.

In another nonlinear embodiment of the present invention, the gain plot 131 of FIG. 7 can be modeled with a polynomial approximation such as the exemplary polynomial approximations 134 and 135. In a polynomial embodiment, the output signal can be expressed, for example, as a third-order polynomial $$V_o = CV_{in}(1 - K_1 V_{in}^2) = CV_{in}(1 - K_2 V_o^2) \qquad (13)$$

wherein $V_{in}$ is the error signal $V_o/A$. For small-level signals (i.e., those near the peak of the gain plot 131), $V_{in}^2$ becomes negligible so that the coefficient C can be found from $$\alpha sm_{i+1} = \alpha sm_i - \mu DV_{o_i}[\alpha sm_i DV_{o_i} - D(V_{o_i}/A)] \qquad (14)$$

wherein $C=1/\alpha sm$. For high-level signals, it is noted that $K_2$ is substantially approximated by $\alpha lg$ which may be obtained from $$\alpha lg_{i+1} = \alpha lg_i - \mu DV_{o_i}[\alpha mod_i DV_{o_i} - D(V_{o_i}/A)] \qquad (15)$$

in which $$\alpha mod_i = \frac{\alpha sm}{1-\alpha lg_i D(V_{o_i})^2} \approx \alpha sm[1+\alpha lg_i D(V_{o_i})^2]. \qquad (16)$$

The error term $V_o G\alpha$ of equation (4) can now be formed with the polynomial estimate $\alpha mod$ that converges from equation (16). It is noted that the latter portion of this equation is especially suited for digital processing because it only involves multiplication of terms.

Figure 8:
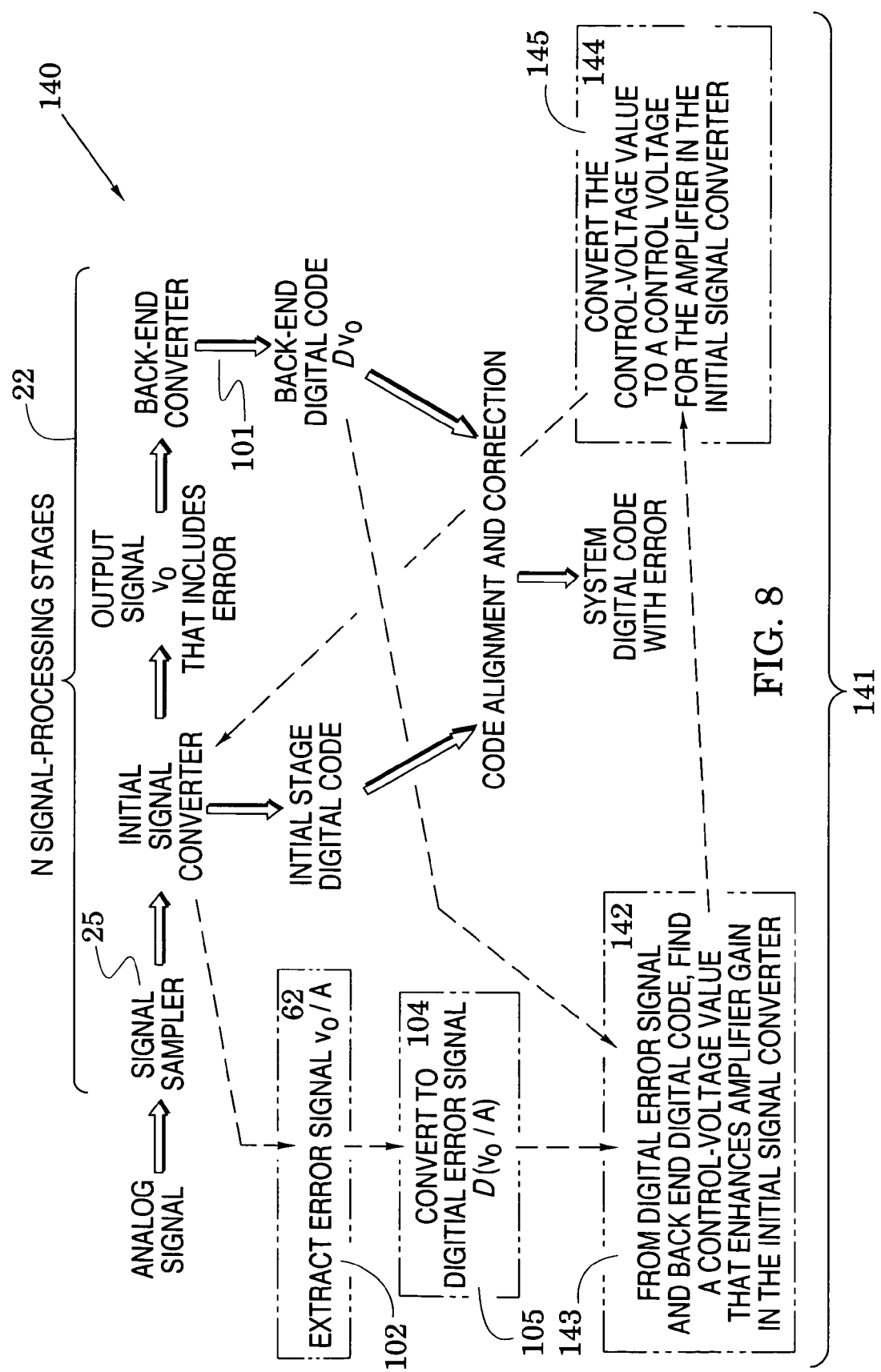
FIG. 8 is a diagram similar to FIG. 6 that shows additional converter processes and structures for reducing converter error due to finite amplifier gain.

A converter system 140 of FIG. 8 includes elements of the system 120 of FIG. 6 with like elements indicated by like reference numbers. The system 140, however, replaces the controller 121 with a controller 141 that comprises a control-voltage controller 142 and a second converter (i.e., a digital-to-analog converter) 144.

In addition, the system 140 is directed to signal-processing stages 22 that have adjustable gain in the amplifiers of their switched-capacitor MDACs wherein that gain is responsive to a control voltage. For example, the amplifiers 52 of FIGS. 2, 3 and 4 are shown to have a port 146 that receives a control voltage $V_c$ and the amplifier gain A of the differential amplifier 52 is responsive to the control voltage $V_c$.

In general, the gain of the amplifier in the selected stage will be a nonlinear and nonmonotonic function of the control voltage $V_c$. In an exemplary amplifier, a differential amplifier gain may vary with control voltage as shown in the gain plot 151 of the gain graph 150 of FIG. 9. As shown, the differential gain reverses sign at a transition value of the control voltage $V_c$ and generally decreases as the control voltage is varied away from this transition value. When absolute value (i.e., magnitude) of the differential gain is considered, the graph 152 results in which a plot 153 indicates absolute gain.

The differential amplifier 52 in FIGS. 2, 3 and 4 can be any of a plurality of amplifier structures that are configured so that their gain responds to a control voltage. For example, at least one differential amplifier embodiment provides positive feedback from its output port to its input port wherein the positive feedback is a function of the control voltage $V_c$. That is, the magnitude of the positive feedback is controlled (increased and decreased) by the control voltage $V_c$. As the positive feedback is initiated and slowly increased, the differential amplifier gain increases. As the positive feedback is further increased, it is found that the amplifier gain reaches a maximum and then begins to decline.

Figure 9:
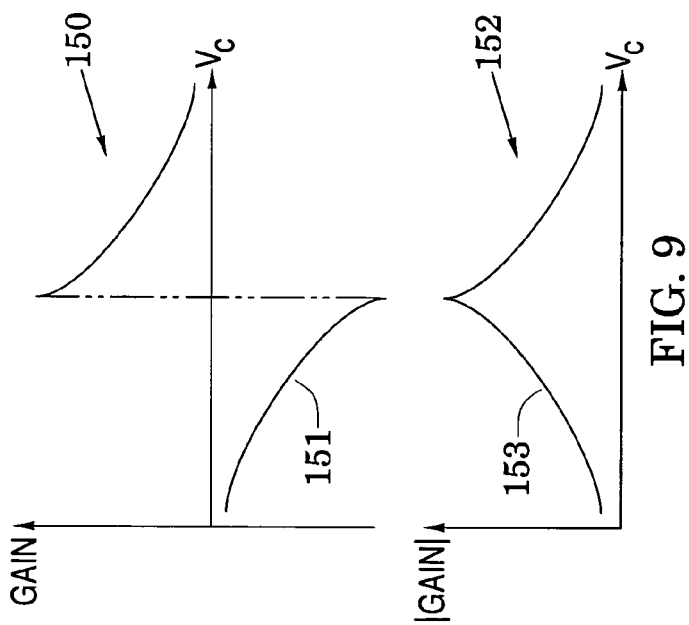
FIG. 9 is a diagram of gain versus control voltage in amplifiers of the signal-processing stages of FIG. 8.

When the absolute amplifier gain A is at its highest point in FIG. 9, the error in the output signal $V_o$ of the initial signal converter of FIG. 8 will be correspondingly reduced which enhances the accuracy of the system digital code out of the code aligner/corrector structure. However, the amplifier gain will typically vary with a variety of parameters (e.g., temperature, production process, and supply voltage) so that it is not practical to obtain the maximum gain with a fixed and predetermined control voltage.

Accordingly, the converter system 140 provides the control-voltage controller 142 which uses a process 143 to form a control-voltage value that reduces a digital error signal $D(V_o/A)$ to thereby enhance amplifier gain A in the initial signal converter. Once this value has been obtained, it is converted in the second converter 144 (in a conversion process 145) to provide the control voltage to the control-voltage port (146 in FIGS. 2, 3 and 4) of the amplifier in the initial signal converter. This provision is indicated by the broken-line arrow between the second converter 144 and the initial signal converter in FIG. 8.

As previously described, an embodiment of the gain estimator 122 of FIG. 6 employed adaptive optimization algorithms to form an estimate $\alpha$ that corresponded to amplifier gain. In particular, it was noted that special cases of methods of steepest descent (e.g., LMS algorithm) could be used because the system 120 of FIG. 6 represented a linear system. As shown in FIG. 9, the gain plot 152 is not representative of a linear system. However, if the magnitude and the sign of the gain are taken into consideration, then a gain optimization surface is provided which is (except for an irrelevant singularity point) compatible with special cases of methods of steepest descent such as the LMS algorithm.

In the converter system 120 of FIG. 6, the gain estimator 122 was configured to determine an estimate $\alpha$ of amplifier gain A and effect an adjustment of the back-end digital code in accordance with the estimate. The control-voltage controller 142 of the system 140 is not directed to estimating the amplifier gain A but, rather, to enhancing (e.g., maximizing) the amplifier gain A by adjusting the gain control voltage via the second converter 144. Embodiments of the control-voltage controller 142 preferably use processes 143 that operate at a process rate that can be substantially less than the sample rate of the signal sampler (25 in FIG. 8). This facilitates the reduction of current demand for added portions of the system 140.

In particular, these processes are configured to reduce the digital error signal $D(V_o/A)$ that is accessed via the extraction amplifier 62 and the first converter 104 of FIG. 8. An exemplary LMS algorithm embodiment is given by, $$v_{i+1}=v_i-\mu D(V_o)D(V_o/A) \qquad (17)$$

wherein $\mu$ is again a step-size parameter that controls rate of convergence and $v_i$ is a control-voltage value which iteratively converges to a control-voltage value $v_{i+1}$ that reduces the digital error signal. As the algorithm progresses, it continuously urges the control-voltage value $v_{i+1}$ to values that further reduce the digital error signal $D(V_o/A)$. The control-voltage value $v_{i+1}$ will thus converge to a value that maximizes the amplifier gain A and this maximization will be maintained even as operational parameters (e.g., temperature) change.

In different system embodiments, the control-voltage controller 142 and the back-end adjuster 144 can be realized with various structures such as an appropriately-programmed processor and/or arrays of gates. In one embodiment, for example, they may both be realized with arrays of multipliers and summers.

Although the initial signal converter was the selected stage in FIGS. 5, 6 and 8 for describing process and structure embodiments of the invention, it is noted that other system embodiments can be directed to other selected stages. This includes the signal sampler 25 of FIG. 6 and all but the final one of the N signal-processing stages. Because a back-end code is not available for this final stage, the embodiments are not generally directed to this stage. If the processes and structures are directed to more than one stage, the transfer function of a selected stage should be addressed only after adjustment has been made for the transfer function of its succeeding stage.

As mentioned above, system embodiments have been generally described with reference to a selected one of the system stages but it is understood that the embodiments may be successively directed to other selected stages which are preferably upstream stages. That is, once the embodiments have been directed to a selected stage, they are then preferably directed to the immediately-preceding stage.

The described system embodiments are thus generally directed to include controllers that may be configured to process, at a process rate less than the sample rate, a digital error signal and the back-end digital code of back-end ones of signal converters that succeed a selected stage to thereby adjust at least one of the back-end digital code and a control voltage in the selected stage to enhance the accuracy of the system digital code. In different embodiments, the controller is realized with the gain estimator 122 of FIG. 6 and the control-voltage controller 142 of FIG. 8.

The embodiments of the invention described herein are exemplary and numerous modifications, variations and rearrangements can be readily envisioned to achieve substantially equivalent results, all of which are intended to be embraced within the spirit and scope of the appended claims.

I claim:

1. An analog-to-digital converter system, comprising:
signal-processing stages which include successive signal converters that process samples of an analog input signal at a sample rate, wherein:
a) all but a last one of said stages has a respective stage gain to thereby provide an output signal to a succeeding one of said stages;
b) said stage gain is realized with the aid of an amplifier that amplifies a signal at an amplifier input node with an amplifier gain; and
c) each of said signal converters is configured to generate a digital code that corresponds to the output signal of the preceding one of said stages;
a code aligner/corrector that temporally aligns and corrects the digital codes of said signal converters to thereby provide a system digital code that corresponds to said analog input signal;
a converter that converts an error signal at the input node of a selected one of said stages to a digital error signal; and
a controller configured to process said digital error signal and the back-end digital code of back-end ones of said signal converters that succeed said selected stage to thereby form an amplifier gain estimate and adjust said back-end digital code with said stage gain and said estimate to enhance the accuracy of said system digital code.

2. An analog-to-digital converter system, comprising:
signal-processing stages which include successive signal converters that process samples of an analog input signal at a sample rate, wherein:
a) all but a last one of said stages has a respective stage gain to thereby provide an output signal to a succeeding one of said stages;
b) said stage gain is realized with the aid of an amplifier that amplifies a signal at an amplifier input node with an amplifier gain that is responsive to a control voltage; and
c) each of said signal converters is configured to generate a digital code that corresponds to the output signal of the preceding one of said stages;
a code aligner/corrector that temporally aligns and corrects the digital codes of said signal converters to thereby provide a system digital code that corresponds to said analog input signal;
a converter that converts an error signal at the input node of a selected one of said stages to a digital error signal; and
a controller configured to process, at a process rate less than said sample rate, said digital error signal and the back-end digital code of back-end ones of said signal converters that succeed said selected stage to thereby adjust at least one of said back-end digital code and said control voltage to enhance the accuracy of said system digital code;
wherein said controller includes:
a gain estimator configured to receive said digital error signal and the back-end digital code of back-end ones of said signal converters that succeed said selected stage and form an estimate which corresponds to amplifier gain in said selected stage; and
a back-end adjustor that, with said stage gain and said estimate, adjusts said back-end digital code into an adjusted back-end digital code that enhances the accuracy of said system digital code.

3. An analog-to-digital converter system, comprising:
signal-processing stages which include successive signal converters that process samples of an analog input signal at a sample rate, wherein:
a) all but a last one of said stages has a respective stage gain to thereby provide an output signal to a succeeding one of said stages;
b) said stage gain is realized with the aid of an amplifier that amplifies a signal at an amplifier input node with an amplifier gain that is responsive to a control voltage; and
c) each of said signal converters is configured to generate a digital code that corresponds to the output signal of the preceding one of said stages;
a code aligner/corrector that temporally aligns and corrects the digital codes of said signal converters to thereby provide a system digital code that corresponds to said analog input signal;
a converter that converts an error signal at the input node of a selected one of said stages to a digital error signal; and
a controller configured to process, at a process rate less than said sample rate, said digital error signal and the back-end digital code of back-end ones of said signal converters that succeed said selected stage to thereby adjust at least one of said back-end digital code and said control voltage to enhance the accuracy of said system digital code;

wherein said controller includes:
 a control-voltage controller configured to receive said digital error signal and the back-end digital code of back-end ones of said signal converters that succeed said selected stage and find a control-voltage value which enhances said amplifier gain; and
 a second converter that converts said control-voltage value to provide said control voltage and thereby enhance the accuracy of said system digital code.

4. An analog-to-digital converter system, comprising:
 signal-processing stages which include successive signal converters that process samples of an analog input signal at a sample rate, wherein:
  a) all but a last one of said stages has a respective stage gain to thereby provide an output signal to a succeeding one of said stages;
  b) said stage gain is realized with the aid of an amplifier that amplifies a signal at an amplifier input node with an amplifier gain; and
  c) each of said signal converters is configured to generate a digital code that corresponds to the output signal of the preceding one of said stages;
 a code aligner/corrector that temporally aligns and corrects the digital codes of said signal converters to thereby provide a system digital code that corresponds to said analog input signal;
 a converter that converts an error signal at the input node of a selected one of said stages to a digital error signal;
 a gain estimator configured to receive said digital error signal and the back-end digital code of back-end ones of said signal converters that succeed said selected stage and form an estimate which corresponds to amplifier gain in said selected stage; and
 a back-end adjustor that, with said stage gain and said estimate, adjusts said back-end digital code into an adjusted back-end digital code that enhances the accuracy of said system digital code.

5. The system of claim 4, wherein the amplifier gain of said selected stage has different gain values that correspond to different output signal levels of said selected stage and said gain estimator is configured to form different estimates that correspond to said different output signal levels.

6. The system of claim 4, wherein the amplifier gain of said selected stage is approximated by a gain polynomial and said gain estimator is configured to form a polynomial estimate that corresponds to said gain polynomial.

7. The system of claim 4, wherein one of said stages is a signal sampler that provides said samples.

8. The system of claim 4, wherein said selected stage includes at least one switched capacitor which is switched to provide said stage gain.

9. The system of claim 4, further including an extraction amplifier in said selected stage that is coupled to said input node and is arranged to provide said error signal to said converter.

10. The system of claim 9, wherein said extraction amplifier is a switched-capacitor amplifier.

11. The system of claim 4, wherein said converter converts said error signal at a conversion rate less than said sample rate and said gain estimator forms said estimate at an estimate rate less than said sample rate.

12. The system of claim 4, wherein said estimate is substantially a ratio of said digital error signal and said back-end digital code.

13. The system of claim 4, wherein said gain estimator is configured to realize said estimate with an adaptive optimization algorithm.

14. The system of claim 13, wherein said adaptive optimization algorithm is a least-mean-square algorithm.

15. The system of claim 13, wherein said gain estimator comprises an array of gates configured to perform said adaptive optimization algorithm.

16. The system of claim 4, wherein said back-end adjuster adds to said back-end code a product of said back-end code, said stage gain and said estimate.

17. The system of claim 16, wherein said back-end adjuster is an array of gates.

18. An analog-to-digital converter system, comprising:
 signal-processing stages which include successive signal converters that process samples of an analog input signal at a sample rate, wherein:
  a) all but a last one of said stages has a respective stage gain to thereby provide an output signal to a succeeding one of said stages;
  b) said stage gain is realized with the aid of an amplifier that amplifies a signal at an amplifier input node with an amplifier gain that is responsive to a control voltage; and
  c) each of said signal converters is configured to generate a digital code that corresponds to the output signal of the preceding one of said stages;
 a code aligner/corrector that temporally aligns and corrects the digital codes of said signal converters to thereby provide a system digital code that corresponds to said analog input signal;
 a first converter that converts an error signal at the input node of a selected one of said stages to a digital error signal;
 a control-voltage controller configured to receive said digital error signal and the back-end digital code of back-end ones of said signal converters that succeed said selected stage and find a control-voltage value which reduces said digital error signal; and
 a second converter that converts said control-voltage value to provide said control voltage and thereby enhance the accuracy of said system digital code.

19. The system of claim 18, wherein one of said stages is a signal sampler that provides said samples.

20. The system of claim 18, wherein said selected stage includes at least one switched capacitor which is switched to provide said stage gain.

21. The system of claim 18, further including an extraction amplifier in said selected stage that is coupled to said input node and is arranged to provide said error signal to said converter.

22. The system of claim 18, wherein said control-voltage controller is configured to realize said control-voltage value with an adaptive optimization algorithm.

23. The system of claim 22, wherein said algorithm is a least-mean-square algorithm.

24. The system of claim 18, wherein said control-voltage controller comprises an array of gates configured to perform said adaptive optimization algorithm at a process rate less than said estimate rate.

* * * * *